(12) United States Patent
Kobayashi et al.

(10) Patent No.: US 6,216,883 B1
(45) Date of Patent: Apr. 17, 2001

(54) WAFER HOLDING HAND

(75) Inventors: Tomoyuki Kobayashi; Junji Takehara, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/462,308

(22) PCT Filed: Jul. 24, 1998

(86) PCT No.: PCT/JP98/03316

§ 371 Date: Jan. 6, 2000

§ 102(e) Date: Jan. 6, 2000

(87) PCT Pub. No.: WO00/05761

PCT Pub. Date: Feb. 3, 2000

(51) Int. Cl.$^7$ .............................. H47F 5/00; B25J 15/08
(52) U.S. Cl. ...................... 211/41.18; 118/728; 206/454; 414/941
(58) Field of Search .................. 211/41.18; 206/454; 118/500, 728; 414/941

(56) References Cited

U.S. PATENT DOCUMENTS

| | | | |
|---|---|---|---|
| 5,810,935 | * | 9/1998 | Lee et al. .............................. 118/728 |
| 5,851,041 | * | 12/1998 | Anderson et al. ............... 414/941 X |
| 5,955,858 | * | 9/1999 | Kroeker et al. . |
| 5,988,191 | * | 11/1999 | Duncan ......................... 211/41.18 X |
| 6,113,165 | * | 9/2000 | Wen et al. ....................... 414/941 X |
| 6,116,848 | * | 9/2000 | Thomas et al. .................. 414/941 X |

FOREIGN PATENT DOCUMENTS

| | | |
|---|---|---|
| 62-216245 | 9/1987 | (JP) . |
| 2-63990 | 5/1990 | (JP) . |
| 5-55342 | 3/1993 | (JP) . |
| 6-310585 | 11/1994 | (JP) . |
| 7-37960 | 2/1995 | (JP) . |
| 7-183359 | 7/1995 | (JP) . |
| 9-107014 | 4/1997 | (JP) . |
| 9-107021 | 4/1997 | (JP) . |

* cited by examiner

*Primary Examiner*—Robert W. Gibson, Jr.
(74) *Attorney, Agent, or Firm*—Sughrue, Mion, Zinn, Macpeak & Seas, PLLC

(57) ABSTRACT

A wafer holding hand of the present invention is constituted so that two fixed clamps (2) and one movable clamp (6) are provided on a finger (1). The movable clamp (6) is supported by a plate spring (8) via a clamp holder (7), and the plate spring (8) is fixed to the slider (9). The slider (9) is driven by an air cylinder (10). The fixed clamp (2) is hook shaped, and the movable clamp (6) is drum shaped. A wafer W is held at three points by the movable clamp (6) and the two fixed clamps (2), and a force is applied to the movable clamp (6) by the plate spring (8) so as to hold the wafer W.

8 Claims, 10 Drawing Sheets

FIG.10
(a)
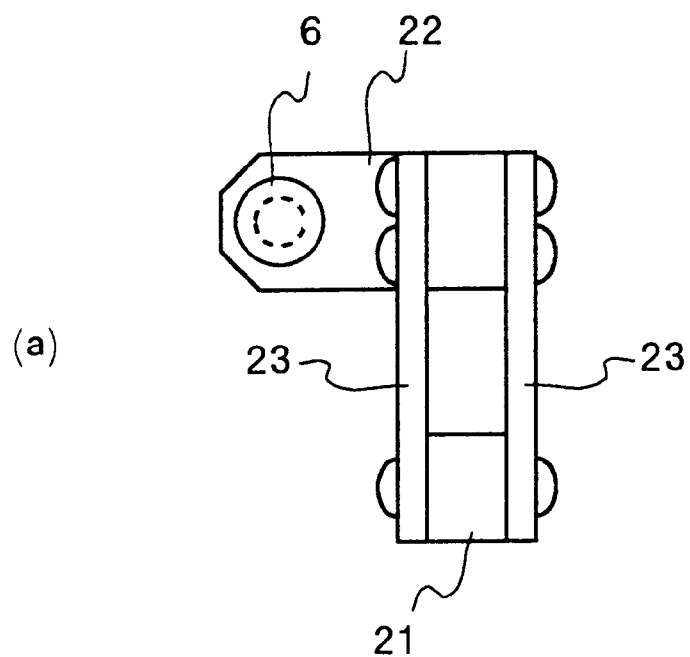
(b)
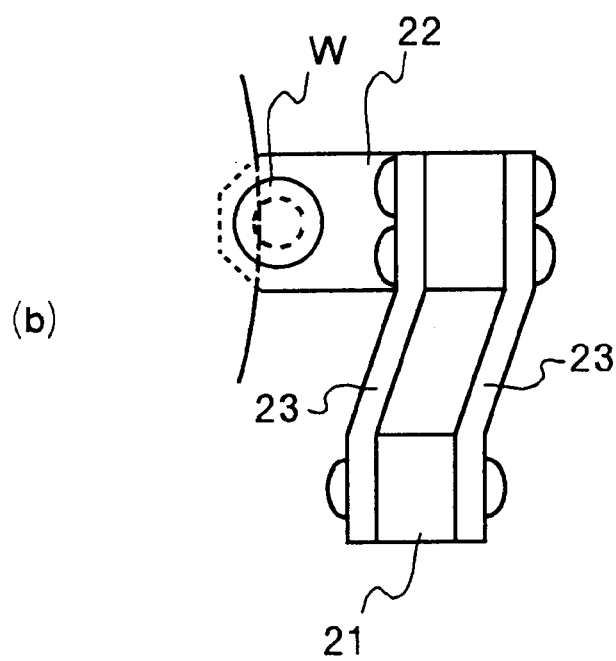

WAFER HOLDING HAND

TECHNICAL FIELD

The present invention relates to a wafer holding hand and transporting it during semiconductor manufacturing process.

BACKGROUND ART

FIG. 11 is a top view showing an example of a conventional wafer holding hand. FIG. 12 is a side view showing the wafer holding hand shown in FIG. 11. The wafer holding hand 200 holds a plurality of wafers W, and it is constituted so that fingers 201 are laminated. A vacuum hole 202 is provided in the center of each finger 201. Moreover, an air passage 203 for letting the air pass which is interconnected with the vacuum hole 202 is formed in the finger 201. Adsorption surface 204 of the finger 201 is finished smoothly so that the wafer W is easily adsorbed. The fingers 201 are laminated with spacers 205 in between and are fixed and supported by a frame 206. When the wafer W is placed on the finger 201 and air is sucked, a vacuum is created in the gap between the adsorption surface 204 and the wafer W, and both of them adsorb to each other. The adsorbed state between the wafer W and the adsorption surface 204 is released by stopping the suction of the air.

FIG. 13 is a top view showing another example of a conventional wafer holding hand. FIG. 14 is a side view of the wafer holding hand shown in FIG. 13. The wafer holding hand 300 has projections 302 along the shape of the wafer W on fingers 301. A slope 303 towards an inner side is provided on the projection 302. The wafer W is held by the projection 302 at the peripheral edge. A plurality of fingers 301 are laminated with spacers 304 in between and are fixed and supported by a frame 305. When the wafer W is placed on the finger 301, it moves along the slope 303 of the projection 302 to a predetermined position and held there.

However, in the wafer holding hand 200 shown in FIGS. 11 and 12, when the air suction is stopped, particles flow backward from the vacuum holes 202. Therefore, there is a possibility that a rear surface of the wafer W which contacts with the adsorption surface 204, and the wafer W on the down-stream side of the air current are contaminated. Moreover, there is a problem that the wafer W cannot be located properly on the finger 201.

In the wafer holding hand 300 shown in FIGS. 13 and 14, the wafer W is positioned by the projection 302, but since the wafer W is supported only by placing it on the projection 302, the wafer W can be transported only in the horizontal direction. Moreover, there is a problem that the transporting speed cannot be increased in order to prevent the wafer W from jumping out.

In addition, in the wafer holding hands 200 and 300, as a number of the fingers 201 and 301 and a number of the spacers 205 and 304 increase, a dimensional tolerance is accumulated. As a result, a tolerance of a distance between the bottommost finger and the topmost finger becomes larger, and thus mounting accuracy of the hand cannot be obtained.

Therefore, it is an object of the present invention to provide a wafer holding hand which is capable of preventing contamination of a wafer and simultaneously transporting the wafer freely, and capable of preventing drop of hand mounting accuracy.

DISCLOSURE OF THE INVENTION

The present invention provides a hand for holding a wafer comprising a plurality of plate-shaped fingers which are laminated; two fixed clamps provided at the tips of said finger, said fixed clamps having an approximately hook shape or approximately drum shape; a movable clamp provided on the fixed side of said finger, which movable clamp having an approximately drum shape or approximately hook shape; an elastic member for holding said movable clamp; and a slider for sliding said elastic member and said movable clamp, wherein said slider is moved and a wafer is sandwiched and held by said movable clamp and constrictions of said two fixed clamps.

Namely, when the wafer is placed on the finger and the movable clamp is moved, the wafer is fixed by the fixed clamp and a constriction of the movable clamp. In such a manner, the wafer is held at three points with the help of the fixed clamps and the movable clamp. Since the movable clamp is supported by the elastic member, a pressure required for holding the wafer is changed by a slider moving amount. In this structure, since the wafer can be held securely, it can be transported on a processing line freely. Moreover, since air is not directly used, the wafer can be prevented from being contaminated.

In addition, in the present invention, a predetermined number of the fingers are fixed to a bracket, and the fingers are mounted to a frame by means of the brackets so that a plurality of the fingers are overlapped.

Namely, when the fingers are mounted to the frame by means of the brackets, an increase in an accumulated dimensional tolerance of the fingers can be suppressed.

In addition, in the present invention, the elastic member is formed from two plate springs, and the plate springs are provided parallel with each other between the slider and the movable clamp.

Namely, when the two plate springs are provided, they move like a link, and thus a force applying direction of the movable clamp can be kept approximately constant.

In addition, in the present invention, the elastic member is provided for each of the fingers.

If a common elastic member is used for a plurality of wafers, when dimensions of the wafers are scattered and a number of wafers is small, an excessive holding force is applied to the wafers. Therefore, the elastic member is provided for each of the fingers so that an excessive holding force is prevented from being applied to the wafers.

BRIEF DESCRIPTION OF THE DRAWINGS

FIGS. 10(a) and 10(b) are explanatory drawings showing modified examples of a plate spring for supporting the movable clamp;

BEST MODE FOR CARRYING OUT THE INVENTION

There will be further detailed below the present invention with reference to the attached drawings.

Figure 1:
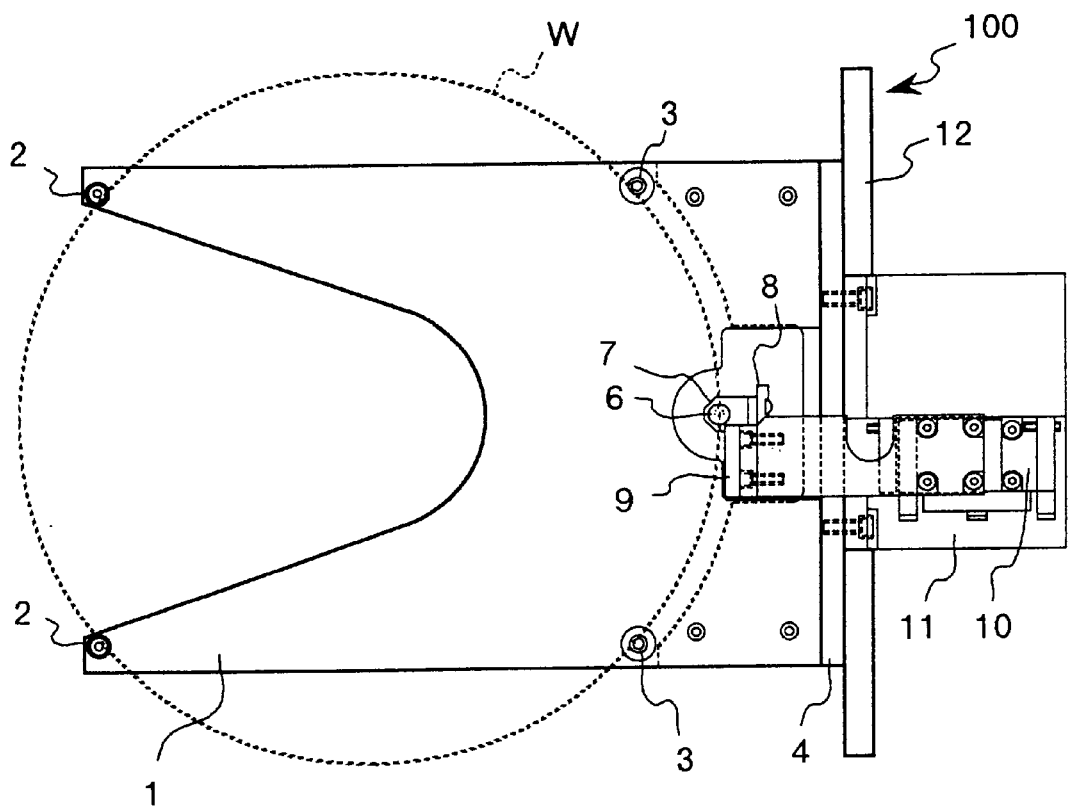
FIG. 1 is a top view showing a wafer holding hand of the present invention.
Figure 2:
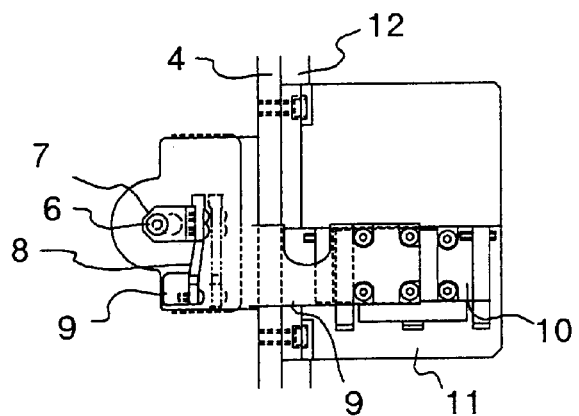
FIG. 2 is a partial explanatory drawing of FIG. 1.
Figure 3:
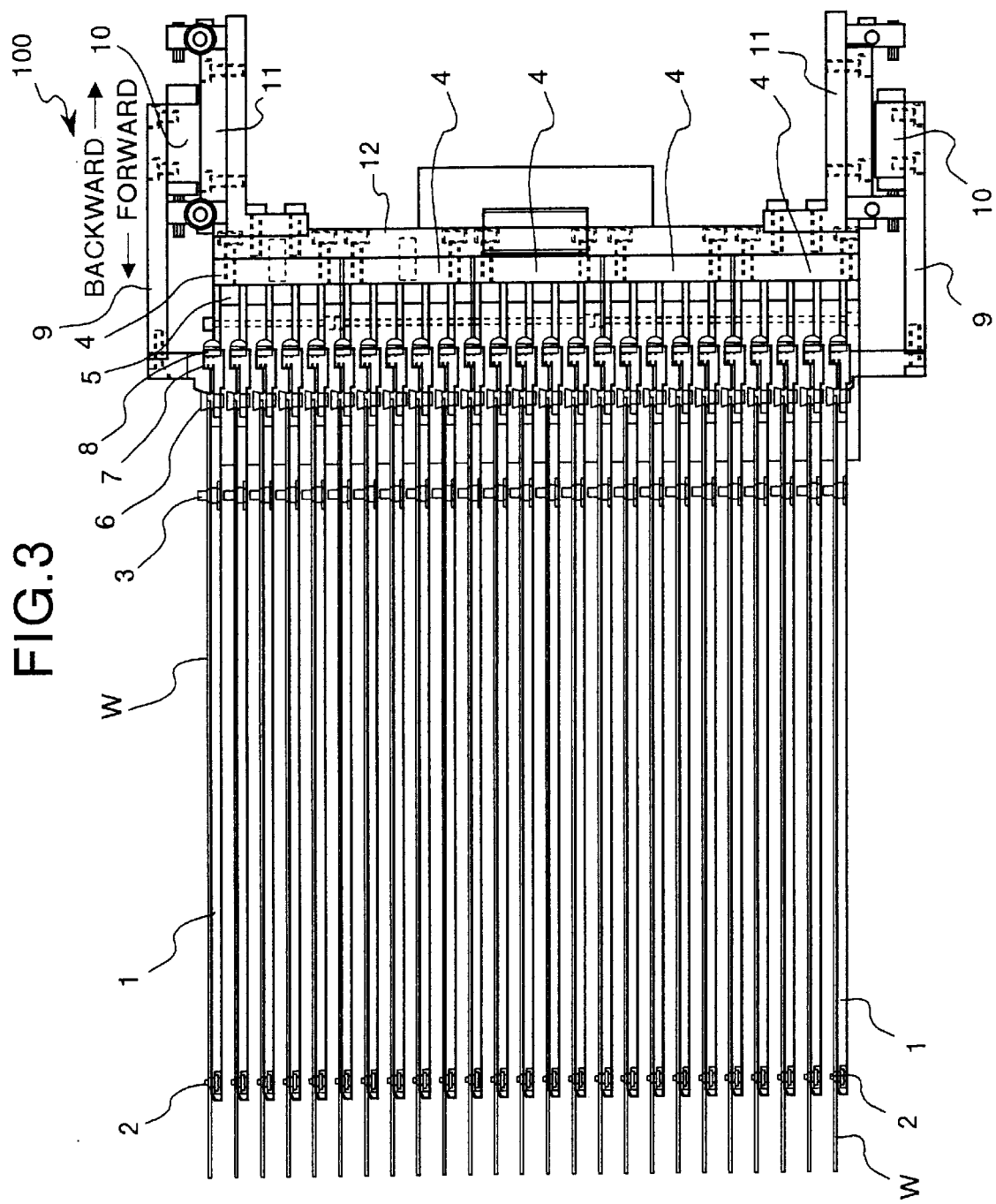
FIG. 3 is a side view showing the wafer holding hand shown in FIG. 1.

FIG. 1 is a top view showing a wafer holding hand of the present invention. FIG. 2 is a partial explanatory drawing of FIG. 1. FIG. 3 is a side view showing the wafer holding hand shown in FIG. 1. The wafer holding hand 100 is constituted so that a plurality of fingers 1 are laminated. The finger 1 is formed in such a way that an approximately V-shaped groove is provided in a plate-shaped body. The two ends of the finger 1 are provided with fixed clamps 2. Moreover, the finger 1 is provided with support clamps 3 correspondingly to each of the fixed clamps 2. The finger 1 is bolted to a bracket 4, and five fingers 1 are fixed to one bracket 4. Spacers 5 are provided in between the fingers. The fixed clamp 2 is hook shaped, and the support clamp 3 is pin shaped. The support clamp 3 roughly positions a wafer W when placed.

A movable clamp 6 is fixed to a clamp holder 7. The movable clamp 6 is drum shaped and is supported by a plate spring 8. The plate spring 8 is fixed to a slider 9. The slider 9 is fixed to an air cylinder 10. Moreover, a movable section of the air cylinder 10 is fixed to a frame 12 via a fixing jig 11. Here, the air cylinder 10 is connected with a solenoid (not shown), and the solenoid is controlled sequentially by a control unit (not shown).

Five fingers 1 are fixed to one bracket 4, and four spacers 5 are provided in between the fingers 1. Five brackets 4 are mounted on the frame 12, and thus a total number of the fingers 1 is twenty-five. The brackets 4 are positioned in the frame 12 by bolt retainers and locating pins. Two sets of the sliders 9 and the air cylinders 10 are provided respectively in upper and lower positions, and the upper and lower air cylinders 10 move linearly and synchronously.

There will be described below an operation of the wafer holding hand 100. FIGS. 4 through 8 are explanatory drawings showing the operation of the wafer holding hand.

Figure 4:
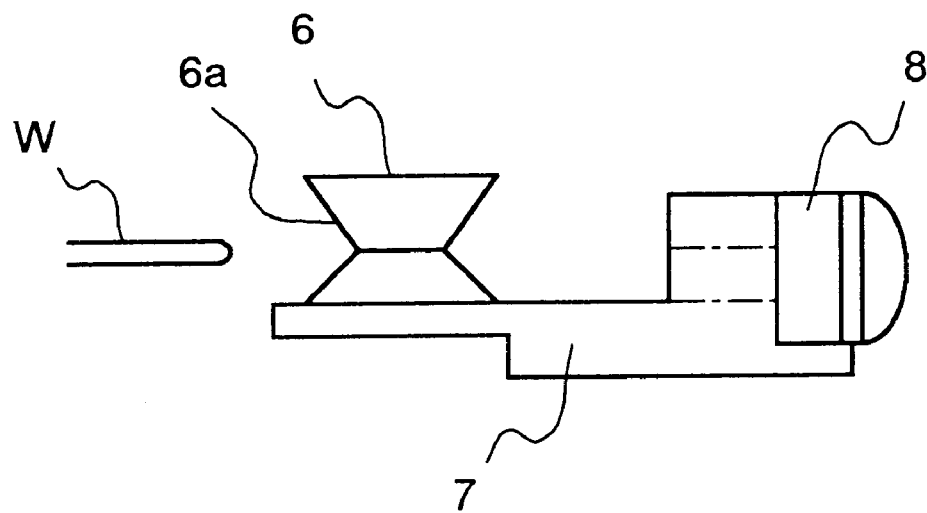
FIG. 4 is an explanatory drawing showing a relationship between a movable clamp and a wafer in a released state.
Figure 5:
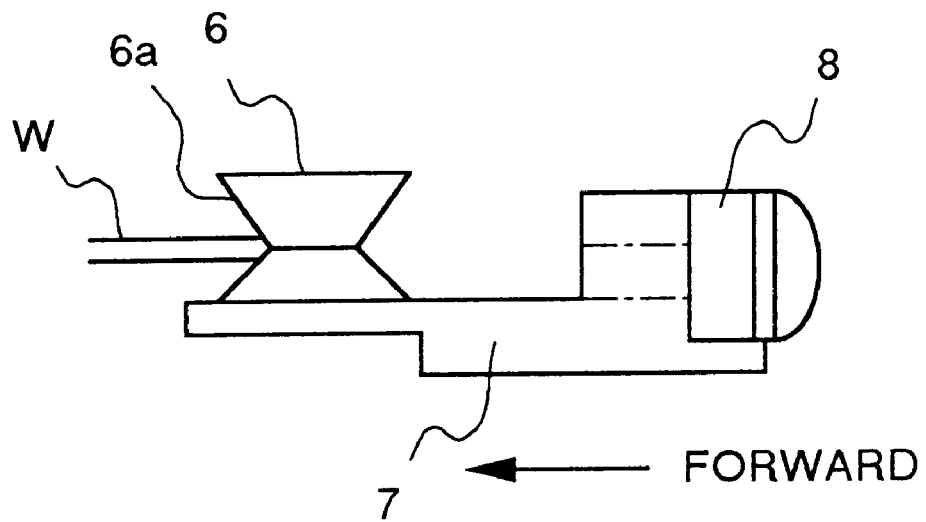
FIG. 5 is an explanatory drawing showing a relationship between the movable clamp and the wafer in a clamped state.

At first, the wafer W is placed on the finer 1. The wafer W is roughly positioned by the fixed clamps 2 and the support clamps 3. The air cylinder 10 is operated based on a command from the control unit. When the air cylinder 10 is operated, the slider 9 moves. When the slider 9 moves, the clamp holder 7 as well as the movable clamp 6 moves in the direction shown by arrows. When the movable clamp 6 moves, the wafer W is located and fixed in a constriction 6a of the movable clamp 6. FIG. 4 shows a relationship between the movable clamp 6 and the wafer W in a released state, and FIG. 5 shows a relationship between the movable clamp 6 and the wafer W in a clamped state.

Figure 6:
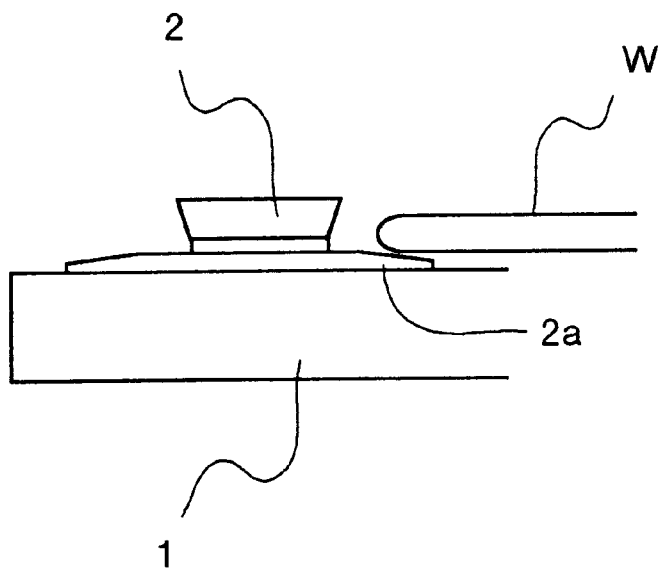
FIG. 6 is an explanatory drawing showing a relationship between a fixed clamp and the wafer in a released state.
Figure 7:
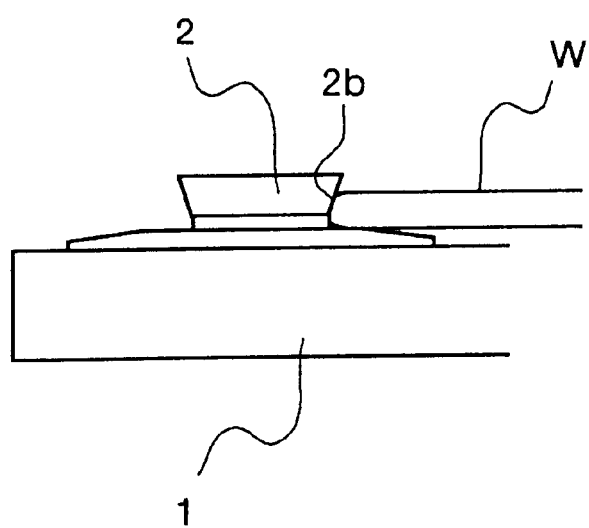
FIG. 7 is an explanatory drawing showing a relationship between the fixed clamp and the wafer in a clamped state.

FIG. 6 shows a relationship between the fixed clamp 2 and the wafer W in a released state. In this state, the wafer W is placed on a seat section 2a of the fixed clamp 2. When the movable clamp 6 moves, the wafer W is pushed to move in a direction of an arrow, and the fixed clamp 2 and the wafer W are fixed. The wafer W is positioned and fixed in a constriction 2b of the fixed clamp 2. FIG. 7 shows a relationship between the fixed clamp 2 and the wafer in a clamped state.

Figure 8:
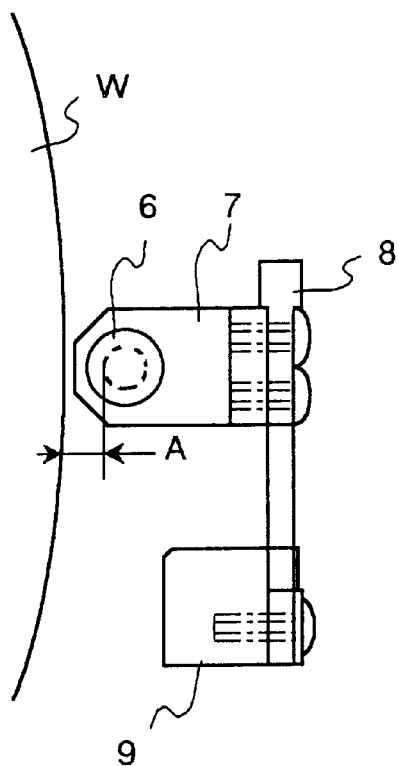
FIG. 8 is an explanatory drawing showing a relationship between the movable clamp and the wafer in a released state.
Figure 9:
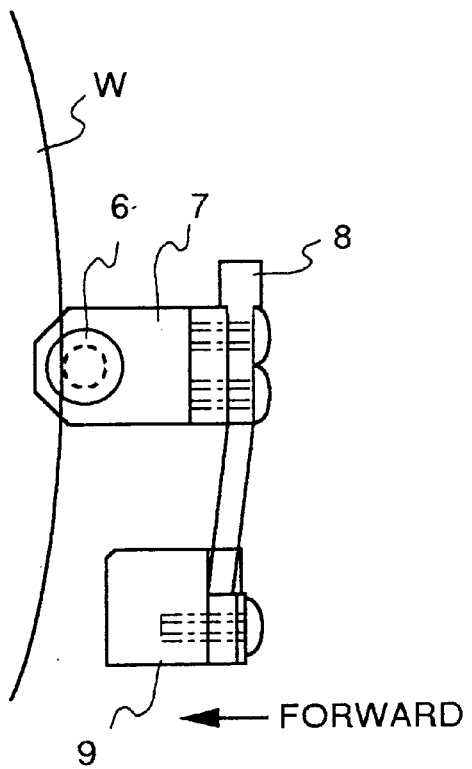
FIG. 9 is an explanatory drawing showing a relationship between the movable clamp and wafer in a clamped state.
Figure 11:
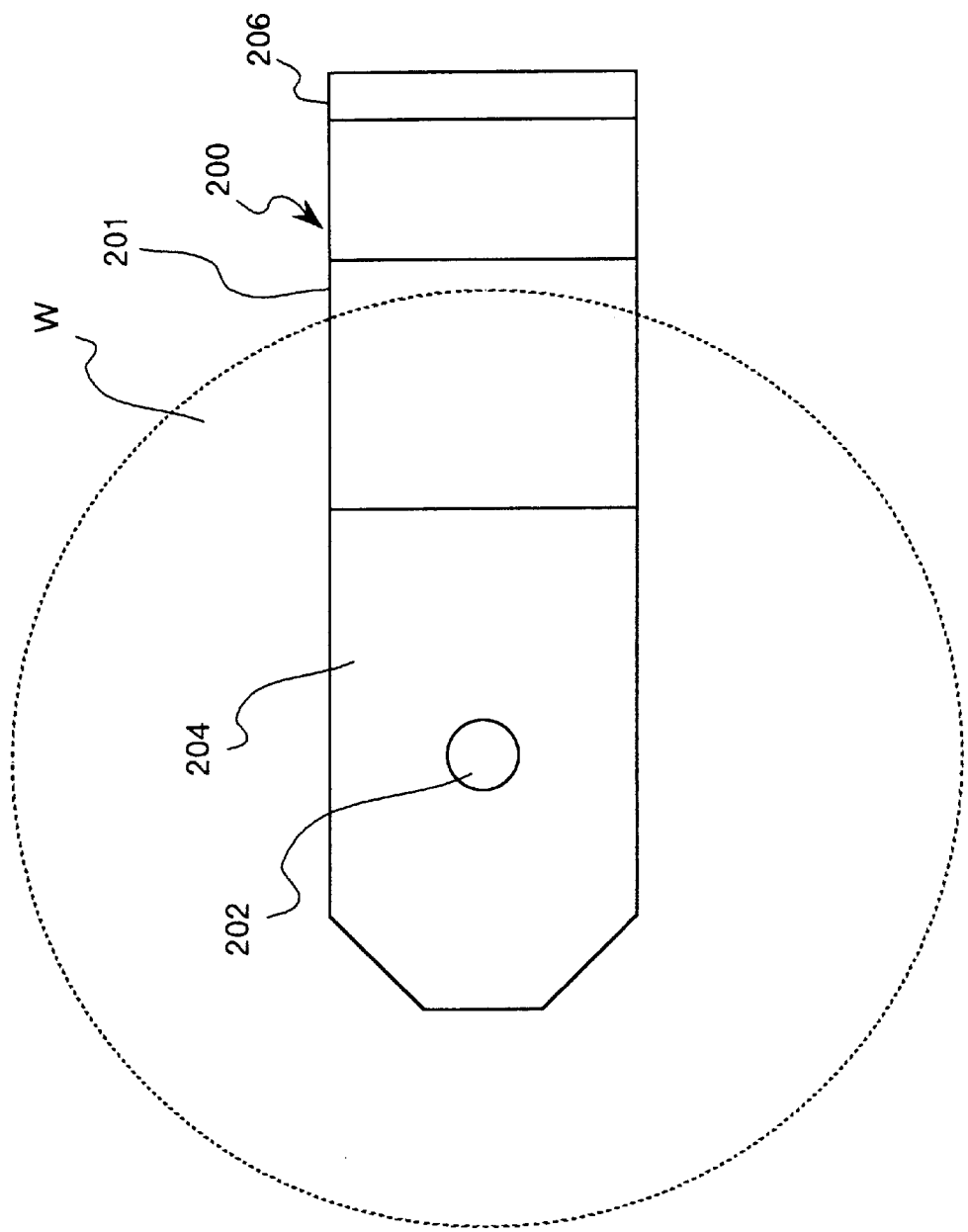
FIG. 11 is a top view showing an example of a conventional wafer holding hand.
Figure 12:
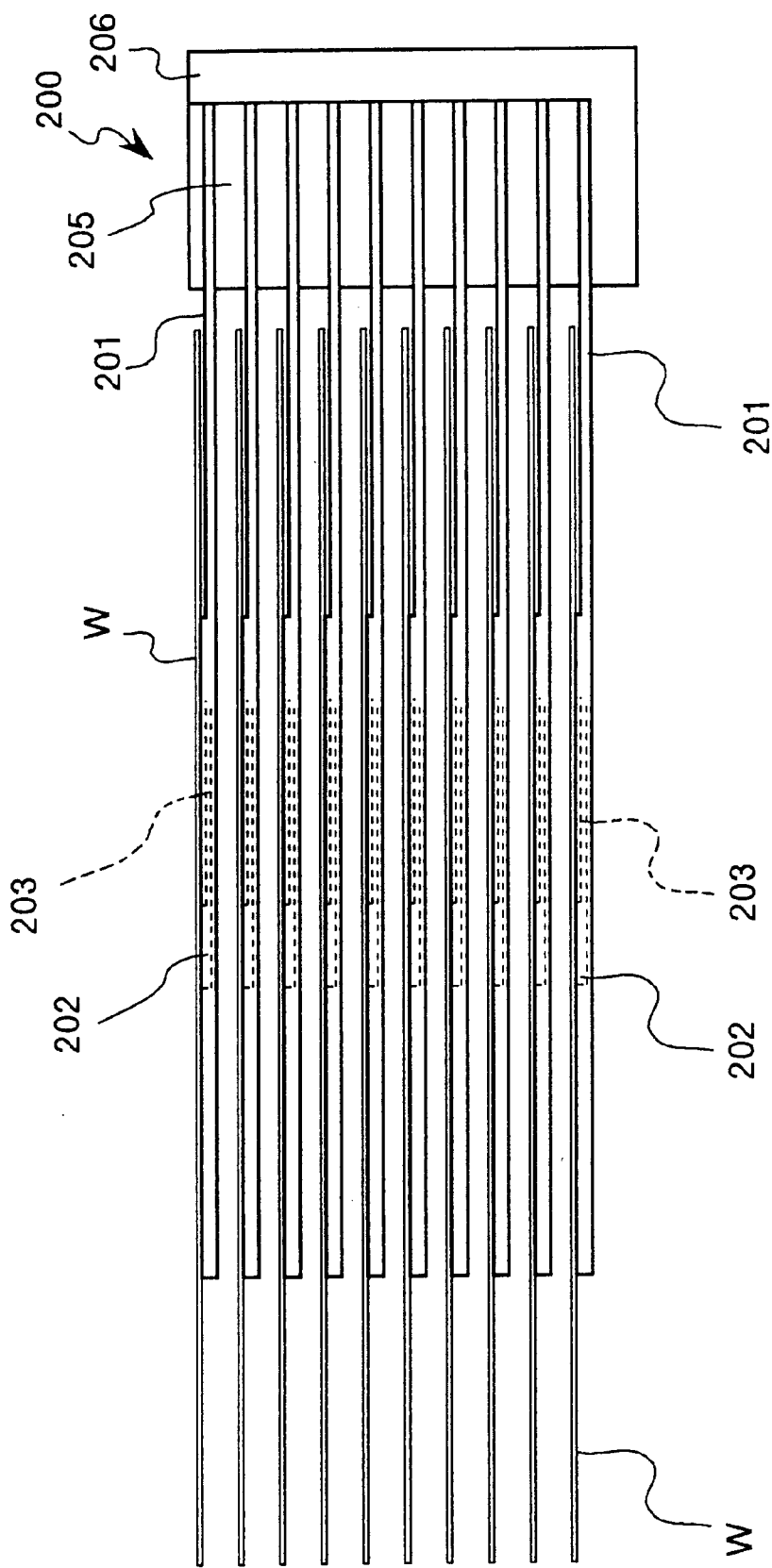
FIG. 12 is a side view showing the wafer holding hand shown in FIG. 11.
Figure 13:
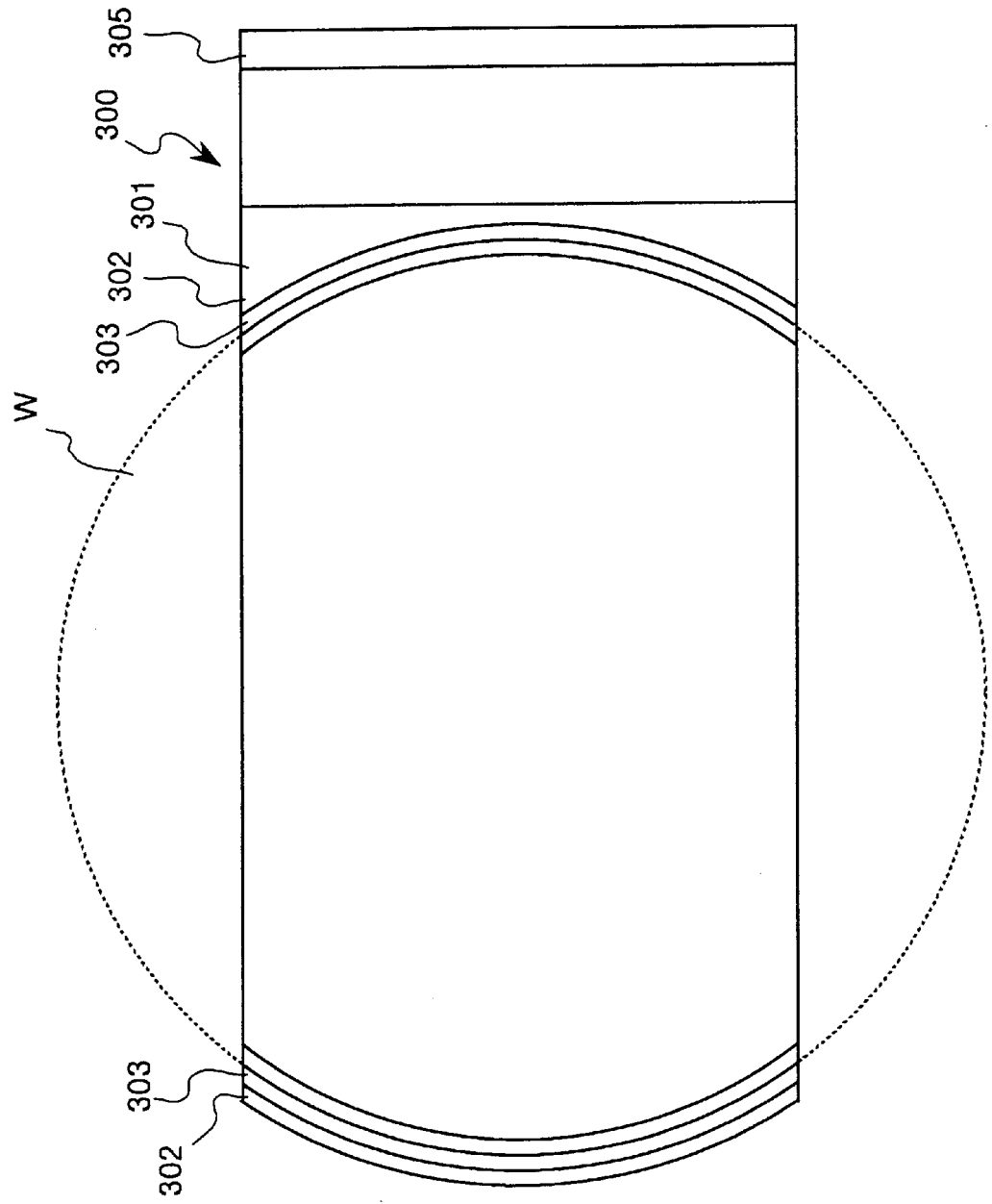
FIG. 13 is a top view showing another example of a conventional wafer holding hand.
Figure 14:
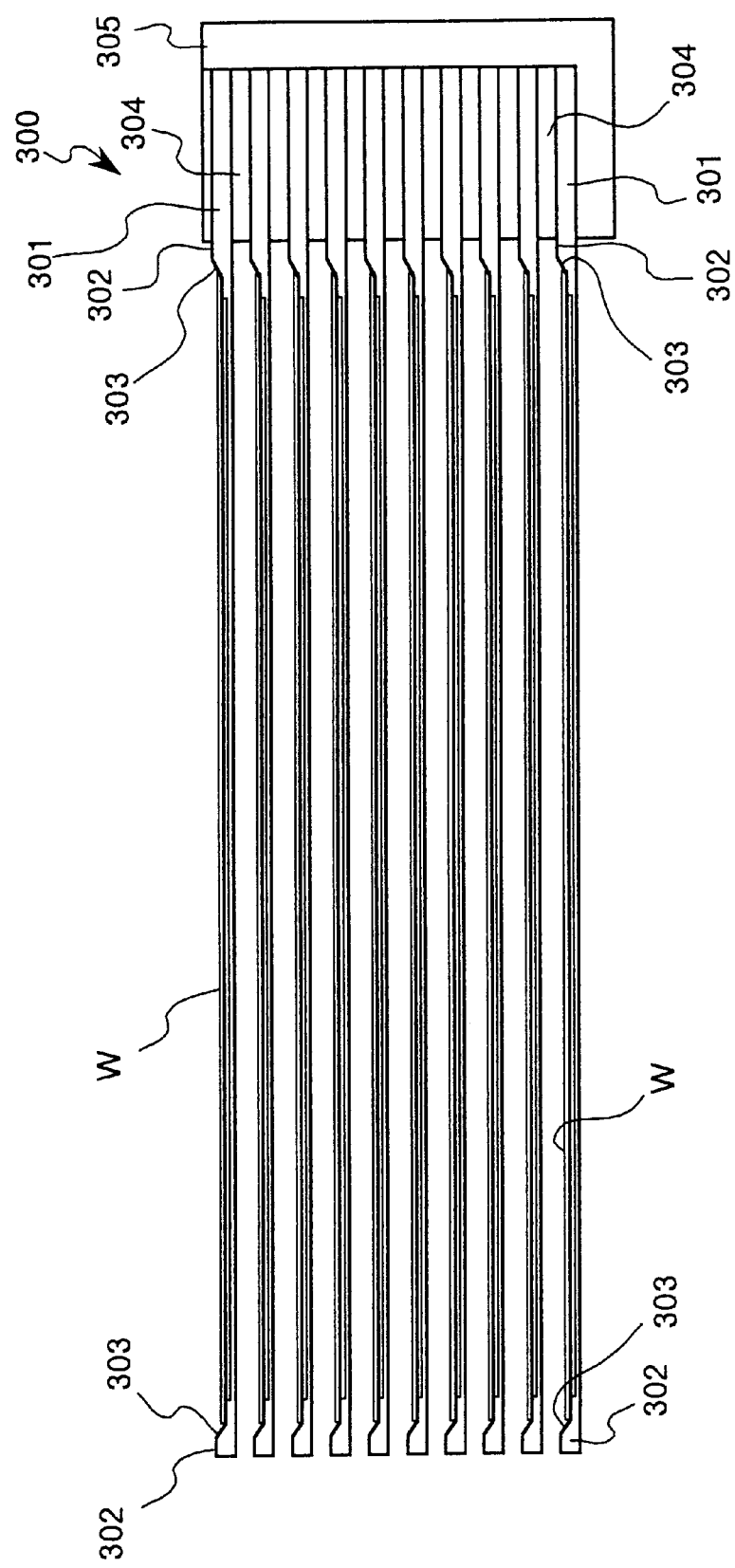
FIG. 14 is a side view showing the wafer holding hand shown in FIG. 13.

As shown in FIGS. 8 and 9, since the slider 9 moves by a distance which is longer than a distance A between the movable clamp 6 and the wafer W, when the movable clamp 6 contacts with the wafer W, a force is applied to the movable clamp 6 against the wafer W by an elastic force of the plate spring 8. This force holds the wafer W in place. Here, as shown in FIG. 8, when the wafer W is released, the force is not applied to the movable clamp 6 by the plate spring 8.

According to the wafer holding hand 100 of the present invention, since the wafer is held at three points by the movable clamp 6 and the two fixed clamps 2, it is not necessary to suck the air, and thus the wafer is not contaminated. Moreover, since the wafer W is clamped, it can be freely transported in any direction. Further, a set of five fingers 1 are fixed to one bracket 4, and the bracket 4 is fastened directly to the frame 12 by a bolt and is positioned by a locating pin. Therefore, a tolerance which is accumulated by laminating the fingers 1 can be suppressed, and thus mounting accuracy of the wafer holding hand is improved. Moreover, the force for holding the wafer W can be adjusted by changing the spring constant of the plate spring 8.

FIG. 10 shows a modification of the plate spring that supports the movable clamp 6. As shown in the drawing, two plate springs 23 may be laid across a slider 21 and a clamp holder 22. FIG. 10(a) is an explanatory drawing showing a state of the plate spring 23 in an wafer released state, and FIG. 10(b) is an explanatory drawing showing a state of the plate spring 23 in the wafer clamped state. In this structure, when the wafer W is clamped, the clamp holder 22 becomes one side of a link. As mentioned above, when the plate spring 23 is deflected and the clamp holder 22 is slanted, the force for holding the wafer W is weakened. However, in the present embodiment, as shown in FIG. 10, since the movable clamp 6 moves approximately linearly with respect to the wafer W, the force for holding the wafer W is not weakened.

INDUSTRIAL APPLICABILITY

As mentioned above, the wafer holding hand of the present invention is suitable for holding a wafer transporting it during manufacturing a semiconductor between processing stages of a series of processing line such as cleaning and etching given to the wafer.

What is claimed is:

1. A wafer holding hand comprising:
    a plurality of plate-shaped fingers which are laminated;
    two fixed clamps provided at a tip of each finger, said fixed clamps having an approximate hook shape or approximate drum shape;
    a movable clamp provided on a fixed side of each finger, said movable clamp having an approximate drum shape or approximate hook shape;
    an elastic member for holding said movable clamp; and
    a slider for sliding said elastic member and said movable clamp,
    wherein said slider is moved and a wafer is sandwiched and held by said movable clamp and constrictions of said two fixed clamps.

2. The wafer holding hand according to claim 1, wherein said elastic member is formed from two plate springs, and the plate springs are provided parallel with each other between said slider and said movable clamp.

3. The wafer holding hand according to claim 1, wherein said elastic member is provided for each of said fingers.

4. The wafer holding hand according to claim 1, wherein a predetermined number of said fingers are fixed to a bracket, and said fingers are mounted to a frame by means of the brackets so that said plurality of fingers are overlapped.

5. The wafer holding hand according to claim 4, wherein said elastic member is formed from two plate springs, and the plate springs are provided parallel with each other between said slider and said movable clamp.

6. The wafer holding hand according to claim 4, wherein said elastic member is provided for each of said fingers.

7. A wafer holding hand comprising:

a plate-shaped finger;

two fixed clamps provided at a tip of said finger, said fixed clamps having an approximate hook shape or approximate drum shape;

a movable clamp provided on a fixed side of said finger, said movable clamp having an approximate drum shape or approximate hook shape;

an elastic member for holding said movable clamp; and a slider for sliding said elastic member and said movable clamp, wherein said slider is moved and a wafer is sandwiched and held by said movable clamp and constrictions of said two fixed clamps.

8. The wafer holding hand according to claim 7, wherein said elastic member is formed from two plate springs, and the plate springs are provided parallel with each other between said slider and said movable clamp.

* * * * *